(12) United States Patent
Markmann et al.

(10) Patent No.: US 8,541,492 B2
(45) Date of Patent: *Sep. 24, 2013

(54) PIGMENT FOR LASER-WRITABLE PLASTIC MATERIALS AND USE THEREOF

(75) Inventors: Joachim Markmann, Dorsheim (DE); Ruediger Wissemborski, Gau-Algesheim (DE)

(73) Assignee: Chemische Fabrik Budenhiem KG, Budenheim (DE)

( * ) Notice: Subject to any disclaimer, the term of this patent is extended or adjusted under 35 U.S.C. 154(b) by 562 days.

This patent is subject to a terminal disclaimer.

(21) Appl. No.: 11/665,363

(22) PCT Filed: Oct. 14, 2005

(86) PCT No.: PCT/EP2005/055281
§ 371 (c)(1),
(2), (4) Date: Mar. 10, 2008

(87) PCT Pub. No.: WO2006/042829
PCT Pub. Date: Apr. 27, 2006

(65) Prior Publication Data
US 2009/0036585 A1    Feb. 5, 2009

(30) Foreign Application Priority Data
Oct. 15, 2004 (DE) .................... 10 2004 050 480

(51) Int. Cl.
*C08K 3/32* (2006.01)
*C01B 25/26* (2006.01)
*C09C 1/00* (2006.01)

(52) U.S. Cl.
USPC ............ 524/413; 524/410; 524/417; 423/306

(58) Field of Classification Search
USPC .......................... 524/413, 417, 410; 423/306
See application file for complete search history.

(56) References Cited

U.S. PATENT DOCUMENTS

| | | | | |
|---|---|---|---|---|
| 5,035,983 A | * | 7/1991 | Kiyonari et al. | 430/346 |
| 5,063,137 A | | 11/1991 | Kiyonari et al. | 430/292 |
| 5,489,639 A | * | 2/1996 | Faber et al. | 524/417 |
| 5,717,018 A | * | 2/1998 | Magerstedt et al. | 524/413 |
| 5,750,318 A | * | 5/1998 | Lambert et al. | 430/346 |
| 6,482,879 B2 | | 11/2002 | Hieltjes et al. | 524/398 |
| 6,706,785 B1 | | 3/2004 | Fu | 523/200 |
| 2004/0121114 A1 | * | 6/2004 | Piana et al. | 428/85 |
| 2007/0295689 A1 | * | 12/2007 | Clauss et al. | 216/65 |

FOREIGN PATENT DOCUMENTS

| | | |
|---|---|---|
| DE | 3917294 | 11/1990 |
| DE | 19531490 | 2/1997 |
| DE | 19707297 | 8/1998 |
| DE | 19905358 | 8/2000 |
| DE | 10053639 | 5/2002 |
| DE | 10145093 | 4/2003 |
| DE | 10255155 | 6/2004 |
| DE | 69531576 | 6/2004 |
| EP | 105451 | 4/1984 |
| EP | 190997 | 8/1986 |
| EP | 330869 | 9/1989 |
| EP | 706897 | 4/1996 |
| EP | 764683 | 3/1997 |
| EP | 1196488 | 8/2004 |
| FR | 2568238 | 7/1984 |
| WO | WO98/58805 | 12/1998 |
| WO | WO99/55773 | 11/1999 |
| WO | WO 00/02869 | 1/2000 |

* cited by examiner

*Primary Examiner* — Kelechi Egwim
(74) *Attorney, Agent, or Firm* — Michael L. Dunn

(57) ABSTRACT

A pigment for laser-writable plastic materials in the form of particulate, light-sensitive compounds which under the influence of laser light change their color and/or lead to a color change in the plastic material is characterized in that the pigments include at least one salt-like compound including at least two different cations or a compound mixture which can be reacted to afford at least one such salt-like compound with at least two different cations, wherein at least one of the cations is selected from a group (A) of the elements Ti, Cr, Mn, Fe, Co, Ni, Cu, Zn, Y, Zr, Nb, Mo, Ag, Sn, Sb, La, Pr, Ta, W and Ce and at least one further cation is selected from a group (B) of the elements of the 3rd to 6th periods of the main groups II and III, the 5th to 6th periods of the main group IV and the 4th to 5th periods of the secondary group III to VIII and the lanthanides of the periodic system of elements. The invention also includes plastic materials containing the pigment or the compound mixture.

16 Claims, No Drawings

PIGMENT FOR LASER-WRITABLE PLASTIC MATERIALS AND USE THEREOF

BACKGROUND OF THE INVENTION

The invention concerns pigments for laser-writable plastic materials in the form of particulate, light-sensitive compounds which under the influence of laser light change their color or lead to a color change in the plastic material.

Research has been concerned for a prolonged period of time with the development of laser-writable plastic materials as laser light can be focused to form very fine beams, this being something that there is a wish to use for the production of text and image on plastic articles. Most plastic materials however are not writable as such as they do not absorb laser light. Therefore, particulate, light-sensitive pigments are added to the plastic material, which pigments change their color under the influence of laser light. That change can be that, with the absorption of laser light, the pigment itself changes its color due to chemical reaction or physical transition into another modification, or however, due to the transmission of absorbed laser energy to the adjacent plastic material, breaks the latter down or otherwise causes it to involve a color change.

The pigments investigated for that purpose in the past were in most cases metal oxides such as titanium dioxide in accordance with EP-A-330 869 or mixtures of such metal oxides as are described in EP 105 451. Certain metal compounds have also already been mentioned as pigments for laser-writable plastic articles such as copper salts (EP-A-706 897) alone or in the presence of other metal compounds (U.S. Pat. No. 5,489,639) which may only be added at such low levels of concentration that they do not interfere with the copper salt added as pigment and do not change their color under the influence of laser light.

The pigments leading to laser writability frequently only afford an inadequate color difference in relation to the plastic material matrix and thus a poor color contrast and poor readability for the inscription. In other cases the initially acceptable color contrast changes with time so that the inscription more or less disappears. In addition, when increasing pigment amounts are added, there is the risk of an unwanted change in the properties of the plastic material.

Therefore the object of the present invention is to find pigments which improve the laser writability, in particular color contrast, and/or make it more durable, without adversely affecting the plastic material properties in an unacceptable manner.

DETAILED DESCRIPTION OF THE INVENTION

That object is surprisingly attained in that the pigments for laser-writable or laser-markable plastic materials having the features set forth in the opening part of this specification comprise at least one salt-like compound including at least two different cations or a compound mixture which can preferably but not exclusively be reacted to afford at least one such salt-like compound with at least two different cations, wherein at least one of the cations is selected from a group (A) of the elements Ti, Cr, Mn, Fe, Co, Ni, Cu, Zn, Y, Zr, Nb, Mo, Ag, Sn, Sb, La, Pr, Ta, W and Ce and at least one further cation is selected from a group (B) of the elements of the 3rd to 6th periods of the main groups II and III, the 5th to 6th periods of the main group IV and the 4th to 5th periods of the secondary group III to VIII or the lanthanides of the periodic system of elements.

More particularly the invention is a pigment for laser-writable plastic materials in the form of at least one particulate, light-sensitive compound which under the influence of laser light results in a color change in a plastic material in which the pigment is present, wherein the pigment includes at least two different cations and corresponding anions wherein at least one of the cations is selected from a group (A) of the elements Ti, Cr, Mn, Fe, Co, Ni, Cu, Zn, Y, Zr, Nb, Mo, Ag, Sn, Sb, La, Pr, Ta, W and Ce and at least one further cation is selected from a group (B) of the elements of the 3rd to 6th periods of the main groups II and III, the 5th to 6th periods of the main group IV and the 4th to 5th periods of the secondary group III to VIII and the lanthanides of the periodic system of elements. The invention also includes a composition comprising a mixture of compounds that can be incorporated into a plastic material and reacted to obtain a pigment.

In accordance with the technical teaching of the present invention therefore salt-like compounds must be so selected and combined together that there is selected from each of the two above-defined groups A and B at least one respective salt-like compound with at least one cation listed for said group, wherein at least one cation from the one group must be different from at least one selected cation from the other group.

The term a salt-like compound is used here in accordance with the invention to denote compounds which in water at least partially dissociate into cations and anions or comprise an acid residue and a base residue.

When on the other hand reference is made here to a color change, that can be a transposition from one color shade to another, such as for example from yellow to red or from transparent to black. In accordance with the invention however that term is also used to denote a lightness change, for example from light brown to dark brown and/or a color change in the plastic material.

The term "particulate" is intended to denote that the pigment is in the form of fine solid particles, in which respect quantitative statements relate to the mean particle size ($d_{50}$) and to the particle size of the primary particles. The size of the primary particles is in the nanometer to micrometer range. Suitable primary particles have mean particle sizes ($d_{50}$) of less than 10 μm, preferably less than 5 μm.

The particle diameter is determined for the purposes of this invention by usual methods such as light scatter, microscopy or electron microscopy, counting flow measurements at thin gaps, sedimentation processes or further commercially available processes.

If the pigments in accordance with the invention comply with the foregoing prerequisites with respect to the selection and combination of the cations of the salt-like compounds those pigments, without departing from the concept of the invention, can additionally contain further cations, in particular those of elements in the 2nd to 5th periods of the main group I. It is also possible to additionally add to the pigments inorganic oxides and/or further coloring additives and/or usual additives modifying certain properties, such as UV stabilizers, stabilizers in relation to weathering, thermal and thermo-oxidative attacks, to improve hydrolytic and azidolytic resistance, lubricants, mold removal aids, crystallization-regulating substances and nucleating agents, fillers, plasticizers and other additives.

The foregoing definition of the concept of the invention embraces two embodiments which can be used alternatively or in combination with each other. The one embodiment provides that the salt-like compounds used for the pigments according to the invention as such have at least two different cations, for example are produced by reaction of at least two simple salts (with a respective cation) and are commercially available in the form of mixed salts. The other embodiment involves the same selection of cations as the first embodiment but comprises a markable mixture, which has not yet reacted with each other, of simple salts. This embodiment is particularly appropriate if, at the subsequent processing temperatures, for example when melting the plastic material or upon another intensification of a process condition, the simple salts present in the mixture react to afford mixed salts, that is to say new reaction products.

There are once again two possible options in regard to the latter embodiment. The simple salt-like compounds contained in the mixture can be reacted with each other prior to the addition to the plastic material which is to be made laser-writable in order to form a salt-like compound having cations in accordance with the selection rules according to the invention, whereupon the reaction product can be used as a pigment for mixing with plastic materials. In accordance with another embodiment the mixture of the simple salts is mixed into the plastic material which to be made laser-writable, before a reaction occurs. Then, when the basic material is heated, the salt-like compounds react with each other and give identical or similar multiple salts which are the same or at least resemble those in the first part of this example.

The color difference obtained with pigments according to the invention can be detected as locally different light density, locally different color values, for example in the CIELab system or locally different color values in the RGB system. Those effects can occur with different light sources.

The selection of the components from groups A and B of the elements is generally so effected that in the wavelength range of the laser light which is available, they have a level of absorption which is as great as possible.

The wavelength ranges of the laser light used are basically not subject to any limitations. Suitable lasers generally involve a wavelength in the range of 157 nm to 10.6 µm, preferably in the range of 532 nm to 10.6 µm. By way of example mention will be made here of $CO_2$ lasers (10.6 µm) and Nd:YAG lasers (1054 nm) or pulsed UV lasers.

Typical excimer lasers have the following wavelength: $F_2$ excimer lasers (157 nm), ArF excimer lasers (193 nm), XeCl excimer lasers (308 nm), XeF excimer lasers (351 nm), frequency-multiplied Nd:YAG lasers with wavelengths of 532 nm (frequency-doubled), 355 nm (frequency-tripled) or 265 nm (frequency-quadrupled). Nd:YAG lasers (1064 and 532 nm respectively) and $CO_2$ lasers are particularly preferably used. The energy densities of the lasers used in accordance with the invention are generally in the range of 0.3 mJ/cm$^2$ to 50 J/cm$^2$, preferably 0.3 mJ/cm$^2$ to 10 J/cm$^2$. When using pulsed lasers the pulse frequency is generally in the range of 1 to 30 kHz.

Laser-sensitive components in the sense of this description are organic or inorganic salt-like compounds with the above-defined combinations of different cations or mixtures of salt-like compounds with the above-defined combinations of different cations, which under the influence of a laser light source, at the irradiated location, change their color and/or lead to a color change in the plastic material.

Those compounds can be classic salts of defined stoichiometry comprising one or more anions with a plurality of but at least two cations derived from different elements, but may also involve compounds which are of a non-stoichiometric composition and which have at least two cations derived from different elements.

The anions are basically not subjected to any limitations as long as the construction of compounds with cations of at least two different elements is possible therewith. Preferably anions which contain at least two different elements are used. Particularly preferred components have as anions oxoanions of the periodic system and the anions of organic carboxylic acids and carbonic acid in so far as mixed compounds with a plurality of cations can be implemented with same. Particularly preferred components have phosphorus-bearing oxoanions as the anions.

Those combinations in which the non-irradiated compound absorbs in the range of the light wavelength used are preferred.

In addition, those combinations are also preferred in which the inherent color of the non-irradiated compound can be adjusted by a variation in the molar ratios of the cations.

In an implementation of the invention the non-irradiated component is of any inherent color and the irradiated component has a color difference which is as marked as possible in relation thereto. In the CIELab system that denotes the occurrence of a high value for dE*, wherein $$dE^* = 2\sqrt{(L^*_1 - L^*_2)^2 + (a^*_1 - a^*_2)^2 + (b^*_1 - b^*_2)^2}$$

wherein index 1 stands for the non-irradiated molding material and index 2 stands for the irradiated material.

The CIELab system involves a color space laid down by the International Lighting Commission (Commission Internationale d'Eclairage) in 1976, wherein L*=lightness, a*=red-green color information and b*=yellow-blue information.

In a preferred embodiment of the invention the non-irradiated compound has a level of lightness which is as high as possible (that is to say a lightness value L* which is as high as possible in the CIELab color space) and an inherent color which is as slight as possible (that is to say a deviation which is as slight as possible from the black-white axis: in quantitative terms a* as small as possible, in quantitative terms b* as small as possible). In that case the irradiated compound should have a level of lightness which is as low as possible (lowest possible lightness value L*) and nonetheless an inherent color which is as slight as possible (in quantitative terms a* as low as possible, in quantitative terms b* as low as possible).

In another preferred embodiment of the invention the non-irradiated compound has a level of lightness which is as high as possible (highest possible lightness value L* in the CIELab color space) and an inherent color which is as slight as possible (lowest possible deviation from the black-white axis: in quantitative terms a* as low as possible, in quantitative terms b* as low as possible). In that case the irradiated component should have an inherent color which is as marked as possible (in quantitative terms highest possible a* and/or b*).

In a preferred embodiment of the composition according to the invention the anions of the above component are of the general formula $A_aO_o(OH)_y^{z-}$, wherein A=trivalent or pentavalent phosphorus, tetravalent molybdenum or hexavalent tungsten, a, o and z are independently of each other integers of values of 1-20, and y is an integer of values between 0-10.

In a further preferred embodiment of the composition according to the invention the pigment has at least one combination of two different elements of the group consisting of copper, tin, antimony and iron.

In a particularly preferred embodiment of the composition according to the invention the pigment has anions of phosphorus (V) and/or phosphorus (III) acid, condensation products thereof or optionally with further hydroxide ions and as cations Cu and Fe or Cu and Sn or Cu and Sb or Sn and Fe.

The pigments according to the invention are desirably used for the production of laser-writability in polymers such as for example in partially crystalline thermoplastic materials, in particular polyacetals, polyesters, polyamides, polyarylene ethers, polyarylene sulfides, polyethersulfones, polyaryletherketones, polyolefins and combinations thereof.

The pigments according to the invention can be employed for making plastic materials writable in the most widely varying technical areas. Processing of the molding materials containing the pigments can be effected in known manner by extrusion, injection molding, vacuum molding, blow molding or foaming. The moldings obtained in that way are frequently used in the computer, electrical, electronic, domestic appliance and vehicle industries. Examples of the laser-writable plastic articles obtained are for example keyboards, cables, conduits, decorative trim strips, functional parts in the heating, ventilation and cooling sector, switches, plugs, levers and handles and many other parts in the building field or electronic field. A further area of application are plastic material tags for the individual identification of animals, in particular working animals, such as poultry rings, cattle tags or ear tags. The inscription effect using pigments according to the invention is very durable.

EXAMPLE 1

20% of copper hydroxide phosphate and 80% of tin phosphate are intensively mixed for 20 minutes in a mixer from the company Turbula. The product is then used in an extruder in the form of a 3% mixture. After the extrusion operation an RBA analysis of the salt is implemented. The RBA analysis reveals a diffraction spectrum which differs markedly from that of the initial salts.

EXAMPLE 2

20% of copper hydroxide phosphate and 80% of tin phosphate are mixed and boiled up as a 20% suspension in local water. The suspension is then filtered off and dried. After drying to a WL below 5% the final product is crushed. The D50 of the end product produced in that way is below 3 μm. Upon analysis by means of X-ray diffraction the end product exhibits a marked deviation from the RBA analysis of the starting products. The L,a,b values of the end product exhibit a marked deviation from the starting products. The end product exhibits an a-value of −2.1 and is thus markedly lighter than the copper hydroxide phosphate which has a-values of −4 to −7 (measurement was effected with a device from Macbeth Color Eye 3000). Writability with laser light shows K-values of over 4 and is thus in the region of CHP without suffering from the disadvantages of green coloration.

EXAMPLE 3

50% of copper hydroxide phosphate and 50% of tin phosphate are mixed and boiled up as a 20% suspension in local water. The suspension is then filtered off and dried. After drying to a WL below 3% the final product is crushed. The D50 of the end product produced in that way is below 5 μm. Upon analysis by means of X-ray diffraction the end product exhibits a marked deviation from the RBA analysis of the starting products. The L,a,b values of the end product exhibit a marked deviation from the starting products. The end product exhibits an a-value of 2.5 and is thus markedly lighter than the copper hydroxide phosphate which has L-values of 5 to 7.

EXAMPLE 4

50% of iron phosphite is mixed with 50% of tin phosphate and then boiled up in local water as a 10% suspension and kept on the boil for 30 minutes. That suspension is then cooled down and separated. The filter cake is dried and then finely crushed. The end product is subjected to RBA analysis. It shows completely original characteristic curves which are not comparable to those of the starting products. The material exhibits good properties as a pigment for laser-writing. The high red component, measured in the a-value, which is typical of iron phosphite, is markedly reduced. The text produced upon writing with laser light (Nd: YAG-laser with a wavelength of 1064 nm) has a high proportion of black pigment.

To ascertain the technical effect of the present invention the products of Examples 4 to 9 and of comparative Examples 2 and 3 were used as a pigment for achieving laser-writability. The Table hereinafter sets out the compositions of the foregoing Examples according to the invention and comparative Examples.

TABLE

| | Comp. (A) (%-wt) | | Comp. (B) (%-wt) | | Comp. (C) (%-wt) | | Comp. (D) (%-wt) | | Light sensitivity | Matrix lightness | Matrix color | Marking darkness | Marking color | Contrast | Topology |
|---|---|---|---|---|---|---|---|---|---|---|---|---|---|---|---|
| V2 | 98.35 | POM | 0.2 | CuFeP | 0 | – | 1.45 | – | $D_{POM}$ | + | 0 | dark gray | + | black-brown | + | 0 |
| 4 | 98.35 | POM | 0.2 | CuSnP | 0 | – | 1.45 | – | $D_{POM}$ | + | + | light | + | black-gray | + | 0 |
| 5 | 97.35 | POM | 0.2 | CuFeP | 0 | – | 2.45 | μ-TiO$_2$ | $D_{POM}$ | 0 | + | white | 0 | black-brown | + | 0 |
| 6 | 97.35 | POM | 0.2 | CuSnP | 0 | – | 2.45 | μ-TiO$_2$ | $D_{POM}$ | 0 | + | white | 0 | black-gray | + | 0 |
| 7 | 98.95 | PBT | 0.2 | CuFeP | 0 | – | 0.85 | – | $D_{PBT}$ | + | 0 | light gray | + | black-brown | + | + |
| 8 | 98.95 | PBT | 0.2 | CuSnP | 0 | – | 0.85 | – | $D_{PBT}$ | 0 | 0 | light | + | black-gray | + | + |
| 9 | 98.75 | PBT | 0.2 | CuFeP | 0.2 | n-TiO$_2$ | 0.85 | – | $D_{PBT}$ | + | + | light gray | + | black-brown | + | + |
| V3 | 98.15 | PBT | 0 | – | 0 | – | 1.85 | μ-TiO$_2$ | $D_{PBT}$ | 0 | + | white | – | gray | – | – |

POM = Hostaform C 9021 from Ticona GmbH, Keisterbach, Germany
PBT = Celanex 2003 from Ticona GmbH, Keisterbach, Germany exhibits a marked deviation from the RBA analysis of the starting products. The L,a,b values of the end product exhibit a marked deviation from the starting products. The end product exhibits an a-value of −2.1 and is thus markedly lighter

What is claimed is:

1. A pigment for laser-writable thermoplastic materials in the form of at least one particulate, light-sensitive compound that absorbs in a range of a laser light wavelength and which under the influence of the laser light results in a color change in a plastic material in which the pigment is present, wherein the pigment comprises at least one mixed salt compound which includes at least two different cations and corresponding anions wherein at least one of the cations is selected from a group (A) of the elements Ti, Cr, Mn, Fe, Co, Ni, Cu, Zn, Y, Zr, Nb, Mo, Ag, Sn, Sb, La, Pr, Ta, W and Ce and at least one further cation is selected from a group (B) of the elements of the 3rd to 6th periods of the main groups II and III, the 5th to 6th periods of the main group IV and the 4th to 5th periods of the secondary group III to VIII and the lanthanides of the periodic table of elements, wherein anions in the pigment contain phosphorus-bearing oxoanions.

2. A composition comprising a mixture of simple salt compounds, which composition can be incorporated into a thermoplastic material and reacted to obtain a pigment according to claim 1, wherein the mixture of simple salt compounds comprises at least two different cations and corresponding anions wherein at least one of the cations is selected from a group (A) of the elements Ti, Cr, Mn, Fe, Co, Ni, Cu, Zn, Y, Zr, Nb, Mo, Ag, Sn, Sb, La, Pr, Ta, W and Ce and at least one further cation is selected from a group (B) of the elements of the $3^{rd}$ to $6^{th}$ periods of the main groups II and III, the $5^{th}$ to $6^{th}$ periods of the main group IV and the $4^{th}$ to $5^{th}$ periods of the secondary group III to VIII and the lanthanides of the periodic table of elements, wherein anions in the pigment contain phosphorus-bearing oxoanions.

3. The composition of claim 2 where the mixture can be reacted by heating.

4. A pigment as set forth in claim 1 having a mean particle size ($d_{50}$) of less than 10 μm.

5. The pigment as set forth in claim 3 where the mean particle size is less than 5μm.

6. A pigment as set forth in claim 1 wherein besides two different cations from groups A and B the pigment contains further cations of elements of the 2nd to 5th periods of the main group I of the periodic table of elements.

7. A pigment set forth in claim 1 wherein cations in the pigment comprise at least one of copper, tin, antimony and/or iron.

8. A pigment as set forth in claim 1 wherein the anions comprise phosphorous (V) acid and/or phosphorous (III) acid or condensation products and the cations are selected from a combination selected from combinations comprising: Cu and Fe, or Cu and Sn, or Cu and Sb, or Sn and Fe.

9. The pigment of claim 8, wherein the pigment further comprises hydroxyl anions.

10. A pigment as set forth in claim 1 wherein the cations are selected from a combination selected from combinations comprising Cu and Sn, Sn and Fe, or Cu and Ca.

11. The pigment as set forth in claim 10, wherein the pigment further comprises hydroxyl anions.

12. A pigment as set forth in claim 1 wherein the compounds of groups A and B are so combined together that the non-irradiated combination of those compounds absorbs in a range of a laser light wavelength to be used.

13. A method for producing laser-writable thermoplastic materials comprising incorporating a pigment according to claim 1.

14. A method for producing laser-writable thermoplastic materials comprising incorporating a pigment according to claim 2 and reacting the composition to obtain a pigment.

15. The method of claim 13 where the thermoplastic material is a partially crystalline thermoplastic material.

16. The method of claim 14 where the thermoplastic material is a partially crystalline thermoplastic material.

* * * * *